United States Patent
Yo

(10) Patent No.: US 7,429,878 B2
(45) Date of Patent: Sep. 30, 2008

(54) APPARATUS FOR CONTROLLING DRIVE CURRENT IN SEMICONDUCTOR INTEGRATED CIRCUIT DEVICES

(75) Inventor: Jung Hyun Yo, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/616,743

(22) Filed: Dec. 27, 2006

(65) Prior Publication Data
US 2007/0146009 A1    Jun. 28, 2007

(30) Foreign Application Priority Data
Dec. 28, 2005    (KR)    ............... 10-2005-0132734

(51) Int. Cl.
    *H03K 19/0175*    (2006.01)
(52) U.S. Cl. ............................... 326/87; 326/27; 326/30
(58) Field of Classification Search .............. 326/26, 326/27, 30, 82–87
    See application file for complete search history.

(56) References Cited

U.S. PATENT DOCUMENTS

| | | | |
|---|---|---|---|
| 6,268,750 B1 * | 7/2001 | Esch, Jr. ............... | 327/170 |
| 6,448,812 B1 * | 9/2002 | Bacigalupo ............ | 326/83 |
| 6,573,753 B1 * | 6/2003 | Snyder ................. | 326/87 |
| 6,751,782 B2 * | 6/2004 | Levin et al. ........... | 716/1 |
| 6,809,546 B2 * | 10/2004 | Song et al. ........... | 326/30 |

* cited by examiner

*Primary Examiner*—Don P Le
(74) *Attorney, Agent, or Firm*—Sherr & Vaughn, PLLC

(57) ABSTRACT

A circuit device for variously controlling a current drive capacity of a semiconductor IC device as required by the user. A circuit device, capable of preventing a semiconductor IC device from failing to drive an external device, preventing an operational speed of the semiconductor IC device from being reduced, and preventing noise from being transferred to the external device.

4 Claims, 2 Drawing Sheets

APPARATUS FOR CONTROLLING DRIVE CURRENT IN SEMICONDUCTOR INTEGRATED CIRCUIT DEVICES

The present application claims priority under 35 U.S.C. 119 and 35 U.S.C. 365 to Korean Patent Application No. 10-2005-0132734 (filed on Dec. 28, 2005), which is hereby incorporated by reference in its entirety.

BACKGROUND

A semiconductor Integrated Circuit (IC) device receives and transmits an electrical signal through its input/output port from/to an external device. The input/output port is connected to an input/output driver in a semiconductor device, wherein the driver is constructed such that a PMOS transistor and an NMOS transistor are connected in series between a positive power supply and a ground, and the gates of the PMOS transistor and the NMOS transistor is controlled by respective enable signals. For example, in order to output "1" to the input/output port, an enable signal of "0" is inputted into the gates of the PMOS and NMOS transistors. An electric current is delivered to the input/output port from a positive power supply connected to a source of the PMOS transistor. In order to output "0" to the input/output port, an enable signal of "1" is inputted into the gates of the NMOS and PMOS transistors. An electric current of the output port is discharged through a ground terminal connected to the source of the PMOS transistor.

As seen from the above, a drive capacity of the input/output driver of the semiconductor IC device is determined according to physical sizes of the PMOS transistor and the NMOS transistor (i.e., widths and lengths of the transistors), which constitute the driver. In comparison to currents required for internal operations of a semiconductor IC device, the input/output port, which has to output an electrical signal to the external devices, needs a greater current, and thus sizes of transistors used in the driver are significantly larger than those of transistors for internal circuits of the semiconductor IC device.

However, even if the driver is optimally designed, the current driving capacity may be insufficient or otherwise may be higher than needed, because there may be widely differing external devices connected to the semiconductor IC devices. In the case where the current drive capacity is insufficient, the speed of the device may suffer, and, in extreme cases, the external device cannot be driven. On the other hand, in cases where the current drive capacity is too high, the external device is provided with unnecessary electrical noise.

SUMMARY

Embodiments relate to a semiconductor circuit technique, and more specifically, to an apparatus capable of controlling a current drive capacity for an input/output port of a semiconductor Integrated Circuit (IC) device.

Embodiments relate to a circuit device for variously controlling a current drive capacity of a semiconductor IC device as required by the user.

Embodiments relate to a circuit device, capable of preventing a semiconductor IC device from failing to drive an external device, preventing an operational speed of the semiconductor IC device from being reduced, and preventing noise from being transferred to the external device.

An apparatus for controlling a drive current according to embodiments includes a driving terminal for selectively coupling an input/output port to a power supply terminal or a ground terminal, and a control terminal coupled to the input/output port through the driving terminal. The control terminal includes a pull up switch for coupling the power supply terminal and the input/output port, and a pull down switch for optionally coupling the ground terminal and the input/output port, and the driving terminal includes (1) a PMOS transistor, a source of the PMOS transistor being connected to the power supply terminal, a gate of the PMOS transistor being connected to a first enable signal, and a drain of the PMOS transistor being connected to an output node, and (2) an NMOS transistor, a source of the NMOS transistor being connected to the ground terminal, a gate of the NMOS transistor being inputted a second enable signal, and a drain of the NMOS transistor being connected to the output node.

According to embodiments, the control terminal is construct to include (1A) a PMOS transistor, whose source is connected to the power supply terminal, whose gate is connected to the ground terminal, and whose drain is connected to the pull up switch, and (1B) an NMOS transistor, whose source is connected to the ground terminal, whose gate is connected to the power supply terminal, and whose drain is connected to the pull down switch, (2A) a PMOS transistor, whose source is connected to the power supply terminal, whose gate is connected to the pull up switch, and whose drain is connected to the output node, and (2B) an NMOS transistor, whose source is connected to the ground terminal, whose gate is connected to the pull down switch, and whose drain is connected to the output node, and (3A) a PMOS transistor, whose source is coupled to the power supply terminal through the pull up switch, whose gate is connected to the ground terminal, and whose drain is connected to the output node, and (3B) an NMOS transistor, whose source is coupled to the ground terminal through the pull down switch, whose gate is connected to the power supply terminal, and whose drain is connected to the output node.

A first switch enable signal is inputted into the pull up switch and a second switch enable signal is inputted into the pull down switch, and values of the first switch enable signal and the second switch enable signal are adjusted such that the pull up switch and the pull down switch are not simultaneously selected.

DETAILED DESCRIPTION

Figure 1:
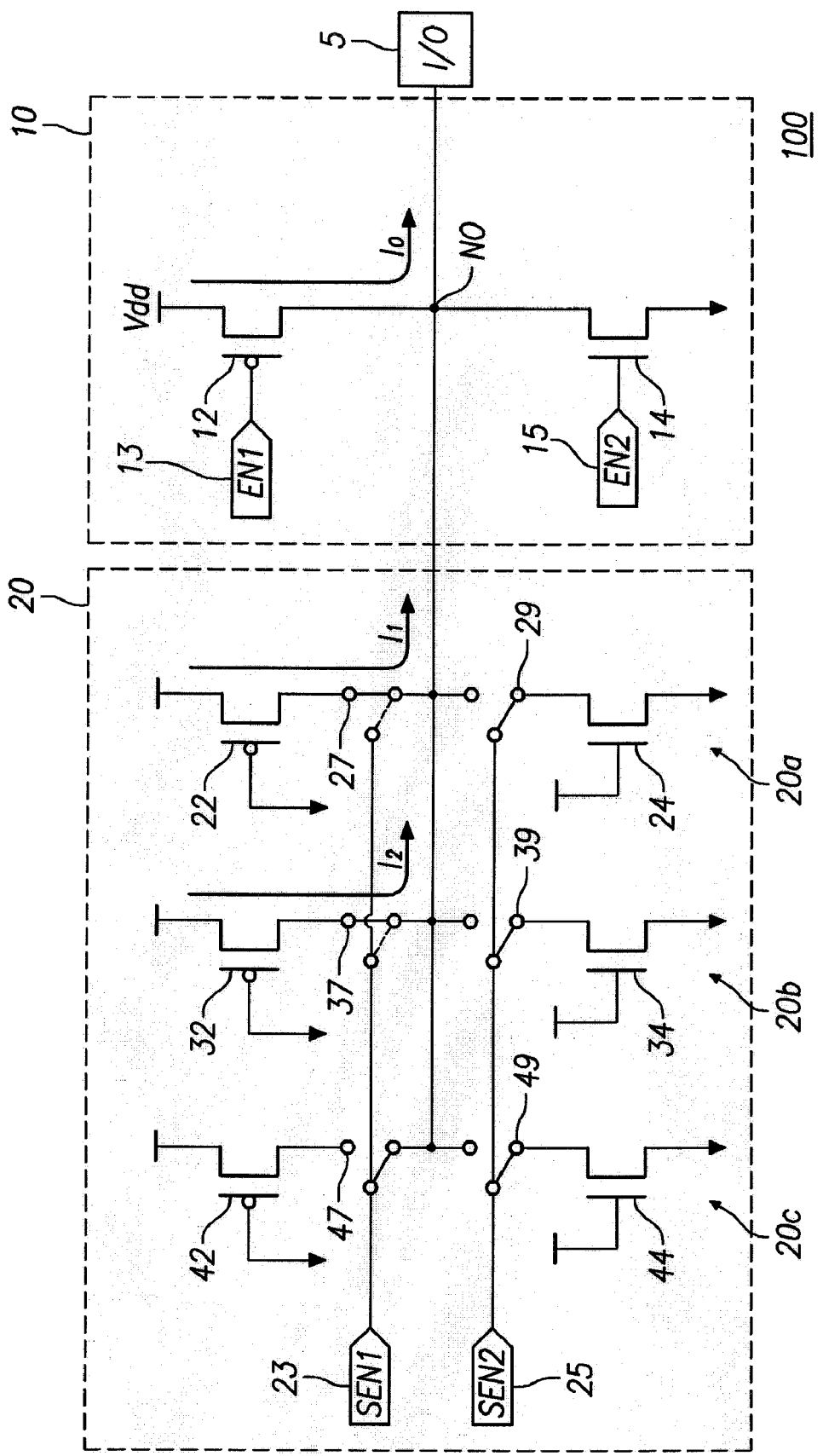
FIG. 1 is a circuit diagram for illustrating an operational example of an apparatus for controlling a drive current in a semiconductor integrated circuit device according to embodiments.

FIG. 1 is a circuit diagram illustrating an example of an apparatus for controlling a drive current according to embodiments.

As shown in FIG. 1, the apparatus for controlling the drive current according to embodiments includes a driving terminal 10 directly connected to an input/output port 5, and a control terminal 20 coupled to the input/output port 5 through the driving terminal 10.

The driving terminal 10 includes a driving PMOS transistor 12 and a driving NMOS transistor 14. A source of the driving PMOS transistor 12 is connected to a power supply $V_{DD}$, a gate thereof is connected to a first enable signal terminal 13, and a drain thereof is connected to an output node NO. A source of the driving NMOS transistor 14 is connected to a ground, a gate thereof is connected to a second enable signal terminal 15, and a drain thereof is connected to the output node NO. A value of a first enable signal EN1 output from the first enable signal terminal 13 is identical to that of a second enable signal EN2 output from the second enable signal terminal 15. Therefore, the driving PMOS transistor 12 and the driving NMOS transistor 14 cannot be simultaneously turned on, and only one of them is turned on at any one time, dependent on the values of the enable signals EN1 and EN2. In order to output data "1" to the input/output port 5, the enable signal EN1 is set as "0" to turn on only the PMOS transistor 12 such that the input/output port 5 is coupled to the power supply VDD, and in order to output data "0" to the input/output port, the enable signal EN2 is set as "1" to turn on only the NMOS transistor 14 such that the input/output port 5 is coupled to the ground.

The control terminal 20 includes three control terminals, i.e., a first control terminal 20a, a second control terminal 20b, and a third control terminal 20c, each of which is connected in series between the power supply VDD and the ground about the output node NO. Those skilled in the art will appreciate that the number of the control terminals in the control terminal 20 is not limited to that of the control terminals shown in FIG. 1, but can be changed according to a drive current to be controlled. In other words, the technical scope of the embodiments is not affected by the number of the control terminals.

Similar to the driving terminal 10, the control terminals 20a, 20b and 20c include PMOS transistors 22, 32 and 42 whose sources are respectively connected to the power supply VDD, and NMOS transistors 24, 34 and 44 whose sources are respectively connected to the ground. A gate of each of the PMOS transistors 22, 32 and 42 in the control terminals 20a, 20b and 20c is connected to the ground, and a gate of each of the NMOS transistors 24, 34 and 44 is connected to the power supply VDD. Further, a drain of each of the PMOS transistors 22, 32 and 42 is coupled to the output node NO through switches 27, 37 and 47, and a drain of each of the NMOS transistors 24, 34 and 44 is coupled to the output node NO through switches 29, 39 and 49. Because the switches 27, 37 and 47 connected to the PMOS transistors 22, 32 and 42 in the control terminal 20 serve to increase a voltage of the output node NO to a high voltage, a set of the switches 27, 37 and 47 is called a pull up switching terminal, and these switches are referred to as a first pull up switch 27, a second pull up switch 37 and a third pull up switch 47, respectively. Further, because the switches 29, 39 and 49 connected to the NMOS transistors 24, 34 and 44 serve to drop a voltage of the output node NO to a ground voltage, a set of the switches 29, 39 and 49 is called a pull down switching terminal, and these switches are referred to as a first pull down switch 29, a second pull down switch 39 and a third pull down switch 49, respectively.

The pull up switching terminal is supplied with a first switch enable signal SEN1 through a terminal 23 and the pull down switching terminal is supplied with a second switch enable signal SEN2 through a terminal 25. Although FIG. 1 shows that the first switch enable signal SEN1 is supplied into the pull up switching terminal through a single signal line stretched from the terminal 23 and the second switch enable signal SEN2 is supplied into the pull down switching terminal through a single signal line stretched from the terminal 25, the pull up switches 27, 37 and 47 and the pull down switches 29, 39 and 49 are respectively supplied with the switch enable signals SEN1 and SEN2 through individual signal lines. That is, the first switch enable signal SEN1 can optionally select the three pull up switches 27, 37 and 47, and the second switch enable signal SEN2 can also optionally select the three pull down switches 29, 39 and 49. However, the values of the switch enable signals SEN1 and SEN2 have to be set such that the pull up switches and the pull down switches are not simultaneously selected. Further, when the switches are selected, they may be sequentially selected in order starting with the nearest to the output node NO or the input/output port 5. The pull up switches and the pull down switches must have minimal resistances so that the drive current is not affected by the switches.

In this way, when a current driver 100 is constructed to include the driving terminal 10 and the control terminal 20, a current drive capacity of the driver 100 can be controlled to a desired level by turning on the PMOS transistor or the NMOS transistor in the control terminal 20 through the switch enable signals SEN1 and SEN2.

An example of FIG. 1 shows a case where the first switch enable signal SEN1 is enabled to turn on the first pull up switch 27 and the second pull up switch 37, and the second switch enable signal SEN2 is set as "0". Since this case is to select the pull up switches, both of the first enable signal EN1 and the second enable signal EN2 in the driving terminal 10 are set as "0". Therefore, a current flowing through the output node NO to input/output port 5 is a sum of a current $I_0$ flowing through the PMOS transistor 12 in the driving terminal 10, a current $I_1$ flowing through the PMOS transistor 22 connected to the first pull up switch 27, and a current $I_2$ flowing through the PMOS transistor 32 connected to the second pull up switch 37, i.e., $I_0+I_1+I_2$, as a drive current. Thus, a total drive current in the above case increases by $I_1+I_2$ compared to a case where only the driving terminal 10 is used.

Figure 2:
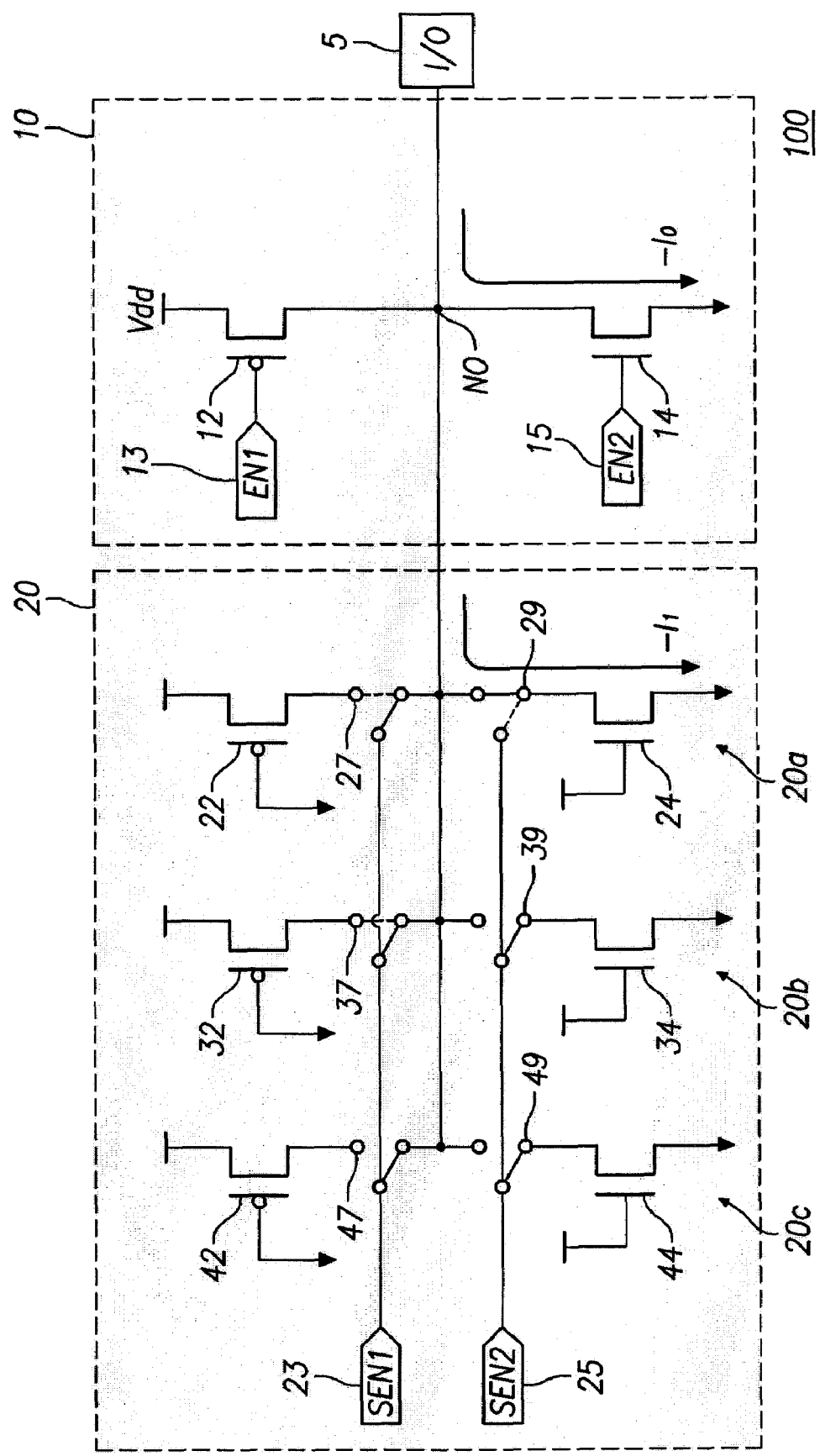
FIG. 2 is a circuit diagram for illustrating another operational example of the apparatus for controlling the drive current in the semiconductor integrated circuit device according to embodiments.

FIG. 2 is a circuit diagram for illustrating another operational example of the apparatus for controlling the drive current according to embodiments.

An example of FIG. 2 shows that both of the first enable signal EN1 and the second enable signal EN2 in the driving terminal 10 are set as "1" to turn on only the NMOS transistor 14, and only the first pull down switch 29 in the control terminal 20 is turned on such that only the NMOS transistor 24 is turned on. Therefore, a current of the input/output port 5 is a sum of a current $-I_0$ flowing through the NMOS transistor 14 in the driving terminal 10 and a current $-I_1$ flowing through the NMOS transistor 24 in the control terminal 20, and thus a drive current of the driver 100 increases.

While embodiments have been described with reference to the drawings, they are intended only to assist those skilled in the art in understanding. It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

For example, although FIGS. 1 and 2 show that the pull up switching terminal and the pull down switching terminal in the control terminal 20 are respectively connected between the drains of the PMOS transistors and the output node, and between the drains of the NMOS transistors and the output node, it is possible to connect the pull up switches between the sources of the PMOS transistors and the power supply $V_{DD}$, and the pull down switches between the sources of the NMOS transistors and the ground. Further, it is also possible to connect the pull up switches to the gates of the PMOS transistors, and the pull down switches to the gates of the NMOS transistors. In the case where the switches are connected to the gates of the transistors, the transistors are turned on only when the switch enable signals SEN1 and SEN2 are inputted therein, differently from the examples of FIGS. 1 and 2 where the PMOS transistors and the NMOS transistors in the control terminal 20 are always on states.

According to the embodiments, a drive current can be optionally controlled by adding the control terminal to the driving terminal in the current driver, as necessary. Therefore, according to embodiments, it is possible to reduce an unnecessary current, provide a drive capacity most suitable for a system employing a semiconductor IC device, and have better noise control and lower power consumption.

Further, by providing a semiconductor IC device capable of controlling drive current, it is possible to ensure a flexibility in making a connection since the high/low output transition time can be freely set when the device is connected to another semiconductor IC device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed:

1. An apparatus capable of controlling a drive current of a driver used in a semiconductor integrated circuit comprising:
   a driving terminal for selectively coupling an input/output port to a power supply terminal or a ground terminal, the driving terminal including a PMOS transistor having a source connected to the power supply terminal, a gate inputted to a first enable signal, and a drain connected to an output node, and an NMOS transistor having a source connected to the around terminal, a gate inputted to a second enable signal, and a drain connected to the output node, wherein the first enable signal and the second enable signal have the same value; and
   a control terminal coupled to the input/output port through the driving terminal, the control terminal including a pull up switch for selectively coupling the power supply terminal and the input/output port, and a pull down switch for selectively coupling the ground terminal and the input/output port, a PMOS transistor having a source connected to the power supply terminal, a gate connected to the ground terminal, and a drain connected to the pull up switch; and an NMOS transistor having a source connected to the ground terminal, a gate connected to the power supply terminal, and a drain connected to the pull down switch, wherein one end of each of the pull up switch and the pull down switch is connected to the output node, and wherein the output node is connected to an input/output node.

2. The apparatus of claim 1, wherein a first switch enable signal is inputted into the pull up switch and a second switch enable signal is inputted into the pull down switch, and values of the first switch enable signal and the second switch enable signal are adjusted such that the pull up switch and the pull down switch are not simultaneously selected.

3. An apparatus capable of controlling a drive current of a driver used in a semiconductor integrated circuit comprising:
   a driving terminal for selectively coupling an input/output port to a power supply terminal or a ground terminal, the driving terminal including a PMOS transistor having a source connected to the power supply terminal, a gate inputted to a first enable signal, and a drain connected to an output node, and an NMOS transistor having a source connected to the ground terminal, a gate inputted to a second enable signal, and a drain connected to the output node, wherein the first enable signal and the second enable signal have the same value; and
   a control terminal coupled to the input/output port through the driving terminal, the control terminal including a pull up switch for selectively coupling the power supply terminal and the input/output port, a pull down switch for selectively coupling the ground terminal and the input/output port, a PMOS transistor having a source connected to the power supply terminal, a gate connected to the pull up switch, and a drain connected to the output node; and an NMOS transistor having a source connected to the ground terminal, a gate connected to the pull down switch, and a drain connected to the output node, wherein the output node is connected to an input/output node.

4. An apparatus capable of controlling a drive current of a driver used in a semiconductor integrated circuit comprising:
   a driving terminal for selectively coupling an input/output port to a power supply terminal or a ground terminal, the driving terminal including a PMOS transistor having a source connected to the power supply terminal, a gate inputted to a first enable signal, and a drain connected to an output node, and an NMOS transistor having a source connected to the ground terminal, a gate inputted to a second enable signal, and a drain connected to the output node, wherein the first enable signal and the second enable signal have the same value; and
   a control terminal coupled to the input/output port through the driving terminal, the control terminal including a pull up switch for selectively coupling the power supply terminal and the input/output port, a pull down switch for selectively coupling the ground terminal and the input/output port, a PMOS transistor having a source coupled to the power supply terminal through the pull up switch, a gate connected to the ground terminal, and a drain connected to the output node; and an NMOS transistor having a source coupled to the ground terminal through the pull down switch, a gate connected to the power supply terminal, and a drain connected to the output node, wherein the output node is connected to an input/output node.

* * * * *